United States Patent
Wu et al.

(10) Patent No.: US 9,286,564 B2
(45) Date of Patent: Mar. 15, 2016

(54) APPARATUSES AND METHODS FOR PRINTED RADIO FREQUENCY IDENTIFICATION (RFID) TAGS

(71) Applicants: Yiliang Wu, Oakville (CA); Paul F. Smith, Oakville (CA)

(72) Inventors: Yiliang Wu, Oakville (CA); Paul F. Smith, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 129 days.

(21) Appl. No.: 13/682,471

(22) Filed: Nov. 20, 2012

(65) Prior Publication Data

US 2014/0138446 A1    May 22, 2014

(51) Int. Cl.
*G06K 7/08* (2006.01)
*G06K 19/06* (2006.01)
*G06K 19/077* (2006.01)

(52) U.S. Cl.
CPC ........ *G06K 19/0775* (2013.01); *Y10T 29/49018* (2015.01)

(58) Field of Classification Search
USPC ............... 235/451, 492, 488; 340/10.2, 10.5, 340/572.1, 572.2; 343/700 M
See application file for complete search history.

(56) References Cited

U.S. PATENT DOCUMENTS

| | | | |
|---|---|---|---|
| 6,300,914 B1 * | 10/2001 | Yang | 343/741 |
| 6,842,148 B2 * | 1/2005 | Hendler et al. | 343/702 |
| 8,179,231 B1 * | 5/2012 | Varahramyan et al. | 340/10.1 |
| 2002/0089049 A1 * | 7/2002 | Leduc et al. | 257/679 |
| 2006/0028378 A1 * | 2/2006 | Gaucher et al. | 343/700 MS |
| 2006/0186204 A1 * | 8/2006 | Lubow | 235/462.01 |
| 2007/0164867 A1 * | 7/2007 | Kawai | G06K 19/07718 340/572.7 |
| 2007/0169336 A1 * | 7/2007 | Luch | G06K 19/07779 29/601 |
| 2008/0035741 A1 * | 2/2008 | Sakama | 235/492 |
| 2008/0136861 A1 * | 6/2008 | Free et al. | 347/21 |
| 2008/0205495 A1 * | 8/2008 | Trott | 375/219 |
| 2008/0308641 A1 * | 12/2008 | Finn | 235/492 |
| 2009/0226605 A1 * | 9/2009 | Chopra et al. | 427/125 |
| 2010/0155492 A1 * | 6/2010 | Forster | 235/492 |
| 2010/0181379 A1 * | 7/2010 | Okegawa et al. | 235/488 |
| 2011/0186980 A1 * | 8/2011 | Lin | 257/690 |
| 2012/0080527 A1 * | 4/2012 | Finn | 235/492 |
| 2012/0100901 A1 * | 4/2012 | Kirsch | 463/11 |
| 2012/0205452 A1 * | 8/2012 | Rofougaran | 235/492 |
| 2014/0132355 A1 * | 5/2014 | Dupuis | 330/298 |

FOREIGN PATENT DOCUMENTS

WO    2011/098892    8/2011

* cited by examiner

*Primary Examiner* — Tuyen K Vo
(74) *Attorney, Agent, or Firm* — MH2 Technology Law Group LLP

(57) ABSTRACT

Apparatuses and methods are provided for providing a printed radio frequency identification (RFID) tag assembly. In one exemplary embodiment, the RFID tag assembly includes a substrate including a top surface, and a receiving layer, comprising a plurality of receiving pads having conductive properties, located on the top surface of the substrate. The RFID tag assembly may further include a chip located on the top surface of the substrate. In addition, the RFID tag assembly may include an antenna printed on the receiving layer and bonded to the receiving layer using at least one of a wedge bonding technique and a ball bonding technique. The antenna may include at least one of copper, aluminum, palladium-covered copper, and aluminum-covered copper wire or ribbon.

17 Claims, 3 Drawing Sheets

APPARATUSES AND METHODS FOR PRINTED RADIO FREQUENCY IDENTIFICATION (RFID) TAGS

TECHNICAL FIELD

The present disclosure generally relates to apparatuses and methods for radio frequency identification and, more particularly, to apparatuses and methods for printed radio frequency identification tags.

BACKGROUND

Radio-frequency identification (RFID) refers to the use of radio-frequency (RF) waves or signals to transmit data. RFID systems typically include RFID tags and RFID readers. An RFID reader, also referred to as an interrogator, may transmit an RF signal to an RFID tag. The RFID tag may receive the signal and, in response, transmit identification information stored in a memory of the RFID tag. RFID tag identification information may include a number identifying the RFID tag and/or it may include information identifying a product to which the RFID tag is attached.

SUMMARY

In accordance with aspects of the present disclosure, the RFID tag assembly can include a radio frequency identification (RFID) tag assembly is disclosed, comprising: a substrate including a top surface; a receiving layer located on the top surface of the substrate; a chip located on the top surface of the substrate; and an antenna comprised of at least one of a ribbon and a wire, wherein the antenna is printed on at least one of the top surface of the substrate, the receiving layer, and the chip, and bonded to at least one of the chip and the receiving layer using a wire bonding technique.

In some aspects, the RFID tag assembly can include wherein the receiving layer includes a plurality of receiving pads and the chip is attached to the top surface of the substrate.

In some aspects, the RFID tag assembly can include wherein the plurality of receiving pads include a conductive material.

In some aspects, the RFID tag assembly can include wherein the antenna is bonded to the receiving layer using a wedge bonding technique.

In some aspects, the RFID tag assembly can include wherein the antenna is bonded to the receiving layer using a ball bonding technique.

In some aspects, the RFID tag assembly can include wherein the receiving layer includes a pre-coated adhesive and the chip is located on the receiving layer.

In some aspects, the RFID tag assembly can include wherein the pre-coated adhesive includes a material having insulating properties.

In some aspects, the RFID tag assembly can include wherein the antenna is comprised of at least one of copper, aluminum, and palladium-covered copper wires or ribbons.

In accordance with aspects of the present disclosure, the disclosed embodiments can include a method for manufacturing a radio frequency identification (RFID) tag assembly, comprising: attaching a chip to a substrate having a top surface; attaching a receiving layer to the top surface of the substrate; locating the chip on the top surface of the substrate; printing an antenna on at least one of the top surface of the substrate, the receiving layer, and the chip, wherein the antenna comprises at least one of a wire and a ribbon; and bonding the antenna to at least one of the chip and the receiving layer using a wire bonding technique.

In some aspects, the method for manufacturing the RFID tag assembly can include wherein the receiving layer includes a plurality of receiving pads and the chip is attached to the substrate.

In some aspects, the method for manufacturing the RFID tag assembly can include wherein the plurality of receiving pads include a conductive material.

In some aspects, the method for manufacturing the RFID tag assembly can include wherein the antenna is bonded to the receiving layer using a wedge bonding technique.

In some aspects, the method for manufacturing the RFID tag assembly can include wherein the antenna is bonded to the receiving layer using a ball bonding technique.

In some aspects, the method for manufacturing the RFID tag assembly can include wherein the receiving layer includes a pre-coated adhesive and the chip is located on the receiving layer.

In some aspects, the method for manufacturing the RFID tag assembly can include wherein the pre-coated adhesive includes material having insulating properties.

In some aspects, the method for manufacturing the RFID tag assembly can include wherein the antenna is bonded to the receiving layer simultaneously when the antenna is printed on to the receiving layer.

In some aspects, the method for manufacturing the RFID tag assembly can include wherein the antenna is comprised of at least one of copper, aluminum, palladium-covered copper, and aluminum-covered copper wires or ribbons.

In accordance with aspects of the present disclosure, the disclosed embodiments can include a method for manufacturing a chipless radio frequency identification (RFID) tag assembly, comprising: attaching a receiving layer to a substrate having a top surface; printing an antenna on at least one of the top surface of the substrate and the receiving layer, wherein the antenna comprises at least one of copper, aluminum, palladium-covered copper, and aluminum-covered copper; and bonding the antenna to the receiving layer using a wire bonding technique.

In some aspects, the method for manufacturing a chipless RFID tag assembly can include wherein the antenna is printed on to and bonded to the receiving layer simultaneously.

In accordance with aspects of the present disclosure, the disclosed embodiments can include a chipless radio frequency identification (RFID) tag assembly, comprising: a substrate including a top surface; a receiving layer, comprising a plurality of receiving pads located on the top surface of the substrate; and an antenna, comprising at least one of copper, aluminum, palladium-covered copper, and aluminum-covered copper, printed on the receiving layer and bonded to the receiving layer using at least one of a wedge bonding technique and a ball bonding technique.

BRIEF DESCRIPTION OF THE DRAWINGS

The accompanying drawings, which are incorporated in and constitute a part of this disclosure, illustrate aspects consistent with the present disclosure and, together with the description, serve to explain advantages and principles of the present disclosure. In the drawings.

DETAILED DESCRIPTION

Figure 1:
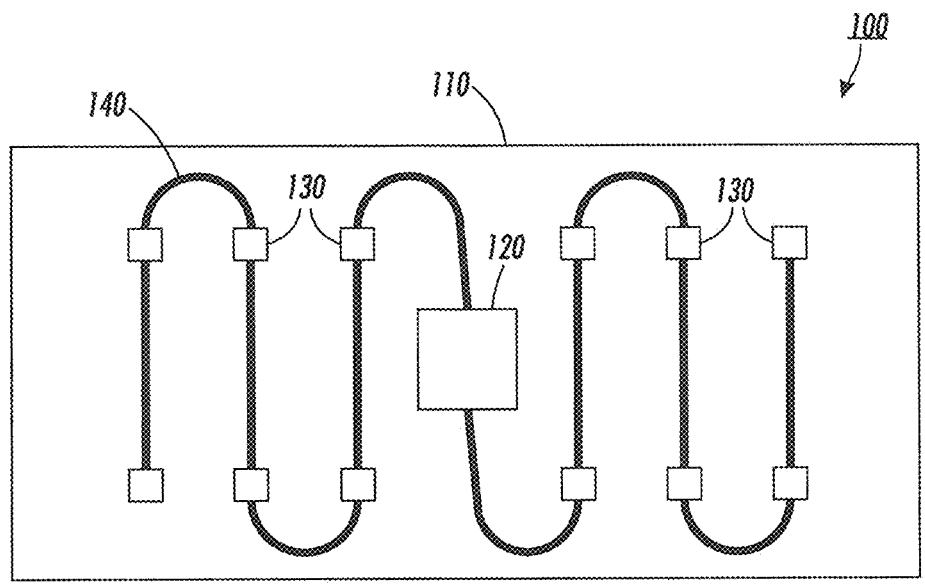
FIG. 1 illustrates a cutaway diagram of an example radio frequency identification (RFID) tag, consistent with certain disclosed embodiments.

Because of its broad applicability and many potential uses, there is a large market for radio frequency identification (RFID). For example, RFID systems may be used for automated tracking and inventory, transportation and logistics management, contactless payments, machine-readable documents and identification, biometric matching and security, animal identification, etc. The high demand can create a corresponding desire to keep production costs low. For both chip-based RFID, including active RFID tag and passive RFID tags, both of which a microchip, as well as chipless RFID, which uses circuitry printed with conductive ink, one of the desires is to inexpensively fabricate low-cost conductive trace as the antenna.

Current methods of fabricating RFID tags either involve chemical etchants or do not permit the use of inexpensive metal as the antenna. In addition, in the case of chip-based RFID tags, these fabrication methods often separate the antenna fabrication process from the process of bonding the chip to the substrate. For example, RFID antennas may be manufactured using an etching method. In such cases, a vacuum metallization (VM) or non-conductive vacuum metallization (NCVM) technique may be used to apply a metal to the substrate within a vacuum chamber by a deposition process. After the metal is applied, a mask may be deposited over the metal, leaving unmasked or exposed the metal to be removed. Etching may then be used to remove the metal in the exposed areas thereby forming an antenna. Although inexpensive metals may be used, this process may involve chemical etchants and, consequently, may generate significant chemical waste.

As another example, metal nanoparticle digital printing may be used for manufacturing RFID tags. Digital printing can allow for individual antenna design, which may be useful in manufacturing chipless RFID tags. For example, printed antennas may be applied on paper and/or polyethylene terephthalate (PET) substrates using silver nanoparticle inks. After printing, the silver nanoparticles can be sintered into highly conductive trace. Although digital printing may use less metal than an etching process, inexpensive metals such as aluminum and copper are often not air-stable. That is, when exposed to ambient oxygen, copper and aluminum nanoparticles may oxidize quickly. Therefore, such inexpensive metals cannot be used.

Embodiments of the present teachings generally relate to apparatuses and methods for radio frequency identification and, more particularly, to apparatuses and methods for printed radio frequency identification tags. In certain disclosed embodiments, a top-down approach may be used to print inexpensive, highly conductive metal trace for RFID tags to form an antenna structure. The disclosed embodiments may use low-cost materials as the metal trace, such as, for example, copper, aluminum, and palladium coated copper wire or ribbons. In addition, the disclosed embodiments may use a digital process that allows for changes to the antenna design, which may be extremely useful for chipless RFID fabrication. The disclosed embodiments may also allow for the antenna fabrication process and the process of bonding the chip to the antenna to be integrated with one another, which may simplify chip-based RFID tag manufacturing. Moreover, the disclosed embodiments may be performed without the use of chemicals and the resulting chemical waste.

The following detailed description refers to the accompanying drawings. Wherever possible, the same reference numbers will be used throughout the drawings and the following description to refer to the same or like parts. While several exemplary embodiments and features are described herein, modifications, adaptations and other implementations are possible, without departing from the spirit and scope of the disclosure. For example, substitutions, additions or modifications may be made to the components illustrated in the drawings, and the exemplary methods described herein may be modified by substituting, reordering or adding steps to the disclosed methods. Accordingly, the following detailed description does not limit the disclosure.

FIG. 1 is a diagram illustrating an example RFID tag, consistent with certain disclosed embodiments. Specifically, FIG. 1 illustrates an example RFID tag 100 having an antenna printed according to the methods and processes disclosed herein. As shown in FIG. 1, RFID tag 100 may include substrate 110, chip 120, receiving layer 130, and antenna 140. In some embodiment, RFID tag 110 may be an active RFID tag 140, and may include an on-board power supply (not shown), such as a battery. In other embodiments, RFID tag 140 may be a passive RFID tag 140, and may instead be powered by received radio frequency (RF) interrogation signals.

Substrate 110 may be any material configured to serve as a stable underlying base layer of RFID tag 100. Substrate 110 may have a top surface and/or a bottom surface, and one or more components, devices, etc. may be attached to the top and/or bottom surfaces. In some embodiments, the top and/or bottom surfaces may be planar surfaces. Chip 120 may be integrated circuit configured with a memory to store data and information, and a processing unit to process the data and information and to modulate and demodulate RF signals. The data and information may include, for example, a number or alphanumeric expression identifying the RFID tag and/or it may include information identifying a product or object to which the RFID tag is attached, such as, for example, a product serial or identification number, a stock number, a lot/batch number, etc. In some embodiments, chip 120 may be a silicon chip.

Receiving layer 130 may be a layer configured to receive the material for antenna 140. In some embodiments, receiving layer 130 may include one or more adhesive layers that are pre-coated or printed onto substrate 110 and configured to receive the material for antenna 140. For example, receiving layer 130 may be one or more layers of any type of pressure-sensitive adhesive film or tape and may be pre-coated or printed onto substrate 110. In other embodiments, receiving layer 130 may include a plurality of bonding pads pre-defined (e.g. printed) on substrate 110. While used in the singular, receiving layer 130 may refer to a plurality of receiving layers 130.

The material used for receiving layer 130 may be chosen based on the method used for connecting or attaching antenna 140 to receiving layer 130. One example method for connecting or attaching antenna 140 to receiving layer 130 is wire bonding, which may include ball bonding and wedge bonding. For example, because ball bonding typically uses a high pulse voltage to melt the wire to form the connection or attachment, a conductive material may be chosen for receiving layer 130 when ball bonding is used as the method for connecting or attaching antenna 140 to receiving layer 130. Thus, in some embodiments, when ball bonding is used, receiving layer 130 may include conductive pads printed on substrate 110 in a pre-determined layout using, for example, silver nanoparticle inks. Antenna 140 may then be attached to the printed silver pads using ball bonding to form the desired shape of antenna 140. Wedge bonding can use pressure to form the connection or attachment. As a result, when wedge bonding is used, receiving layer 130 may be conductive or have conductive properties, such as, for example, printed silver nanoparticle receiving pads, or receiving layer 130 may be an insulator or have insulating properties, such as, for example, pressure-sensitive adhesive materials. A ball bonding technique may be capable of providing an interconnect of up to 10 mm long, whereas a wedge bonding technique may be capable of providing a much longer interconnect. In embodiments, the adjacent conductive receiving pads have a distance less than 20 mm, including, less than 10 mm, or less than 5 mm. The adhesive force between the pressure-sensitive adhesive receiving layer and the wire or ribbons is larger than 0.5 grams, including larger than 2 grams, or larger than 5 grams. With both wire bonding techniques, the process of bonding the chip can be done contemporaneously, or near-contemporaneously, with the antenna fabrication process.

Antenna 140 may be any conductive wire or ribbon configured to enable RFID tag 100 to send and/or receive data using RF waves. Depending on the antenna design, among other things, the data stored in RFID tag 110 may be read from up to several yards away without having to be within a line of sight of the RFID reader. In some embodiments, the RF energy from the RFID reader (not shown) may be received by antenna 140 and used to provide power to chip 110, which may then change the electrical load on the antenna to reflect back its own signals. In some embodiments, any type of conductive wire or ribbon may be used for antenna 140, including, for example, silver, gold, and/or lower-cost wires or ribbons, such as, copper, aluminum, palladium-coated copper, aluminum-coated copper, etc. In addition, in some embodiments, any size of conductive wire or ribbon may be used for antenna 140, including, for example, wires having a diameter between approximately 10 micrometers and 100 micrometers, or from about 15 micrometers to about 50 micrometers, and ribbons having a thickness between approximately 5 micrometers and 50 micrometers or from about 5 micrometers to about 30 micrometers, and a width between approximately 10 micrometers and 200 micrometers or from about 20 micrometers to about 150 micrometers.

Figure 2:
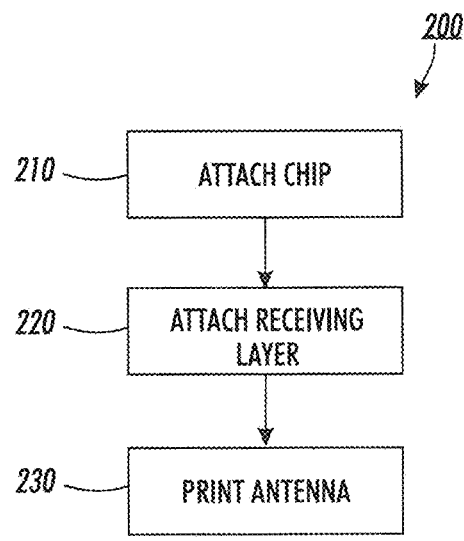
FIG. 2 is a flowchart illustrating an example method for manufacturing printed RFID tags, consistent with certain disclosed embodiments.

FIG. 2 is a flowchart illustrating an example method for manufacturing printed RFID tags, consistent with certain disclosed embodiments. Specifically, FIG. 2 illustrates a flowchart 200 consistent with example implementations of the present disclosure in which a top-down, layered process is used to manufacture an RFID tag, such as RFID tag 100.

As shown in FIG. 2, chip 120 may be attached to substrate 110 (210). Receiving layer 130 may also be attached to substrate 110 (220). As discussed above in connection with FIG. 1, receiving layer 130 may be an adhesive layer that is pre-coated or printed onto substrate 110, whereas, in other embodiments, receiving layer 130 may be a plurality of bonding pads printed onto substrate 110. It is to be anticipated that the attachment of chip 120 and the attachment of receiving layer 130 may be interchanged. That is, in some embodiments, receiving layer 130 may be attached to substrate 110 before chip 120 is attached to substrate 110.

Next, antenna 140 may be printed (230). In some embodiments, antenna 140 may be printed onto the layered substrate 110, chip 120, and receiving pads 130, and bonded to chip 120 and/or receiving pads 130 using a wire bonding process, as discussed above in connection with FIG. 1. A nozzle or other printing device may be used to print antenna 140. The motion of nozzle can be designed and programmed digitally. Therefore, the antenna design can be changed easily. In embodiments, the printing and bonding steps or process take place simultaneously.

In embodiments in which the printed RFID tag is a chipless RFID tag, the method for manufacturing a printed, chinless RFID may be similar to that disclosed in FIG. 2. That is, receiving layer 130 may be attached to substrate 110 in a manner similar to that disclosed in 220 of FIG. 2. As discussed above in connection with FIG. 1, receiving layer 130 may be an adhesive layer that is pre-coated or printed onto substrate 110, whereas, in other embodiments, receiving layer 130 may be a plurality of bonding pads printed onto substrate 110. Next, antenna 140 may be printed in a manner similar to that disclosed in 230 of FIG. 2. In some embodiments, antenna 140 may be printed onto the layered substrate 110 and receiving pads 130, and bonded to receiving pads 130 using a wire bonding process, as discussed above in connection with FIG. 1. As discussed above in connection with FIG. 2, a nozzle or other printing device may be used to print antenna 140.

Figure 3A:
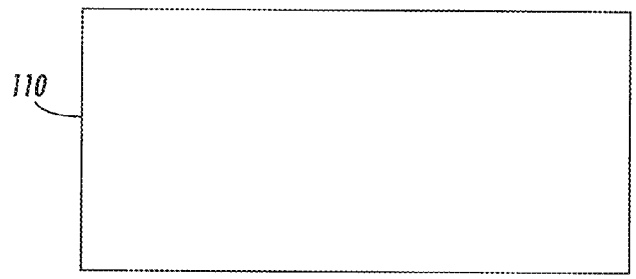
FIG. 3a is a top-view diagram illustrating an example method for manufacturing printed RFID tag, consistent with certain disclosed embodiments.
Figure 3B:
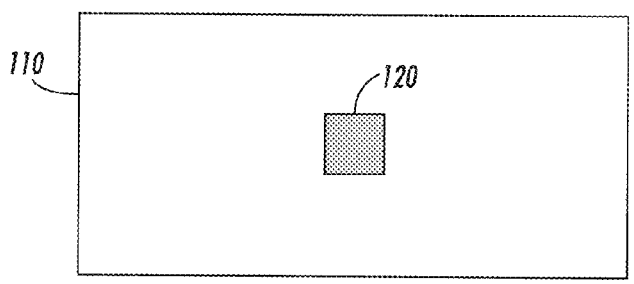
FIG. 3b is a top-view diagram illustrating an example method for manufacturing printed RFID tag, consistent with certain disclosed embodiments.
Figure 3C:
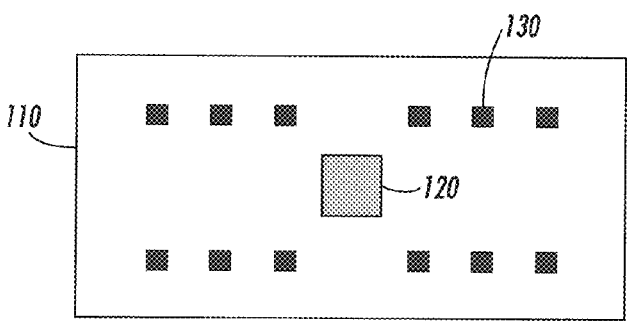
FIG. 3c is a top-view diagram illustrating an example method for manufacturing printed RFID tag, consistent with certain disclosed embodiments.
Figure 3D:
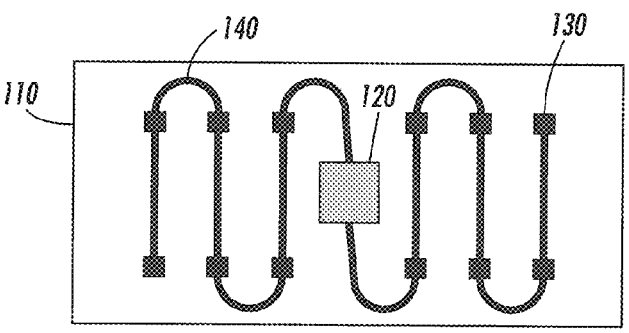
FIG. 3d is a top-view diagram illustrating an example method for manufacturing printed RFID tag, consistent with certain disclosed embodiments.

FIGS. 3*a*-3*d* each is a top-view diagram illustrating an example method for manufacturing printed RFID tag, consistent with certain disclosed embodiments. Specifically, FIGS. 3*a*-3*d* illustrate the example method of flowchart 200 of FIG. 2. FIG. 3*a* illustrates an example top-view of substrate 110 prior to attachment of chip 120. FIG. 3*b* illustrates an example top-view of substrate 110 following attachment of chip 120 to substrate 110 (210 of FIG. 2). FIG. 3*c* illustrates an example top-view of substrate 110 following attachment or printing of receiving layer 130 (220 of FIG. 2). As noted above, it is to be anticipated that, in some embodiments, receiving layer 130 may be attached to substrate 110 before chip 120 is attached. FIG. 3*d* illustrates an example top-view of substrate 110 following printing and bonding of antenna 140 (230 of FIG. 2).

Figure 4:
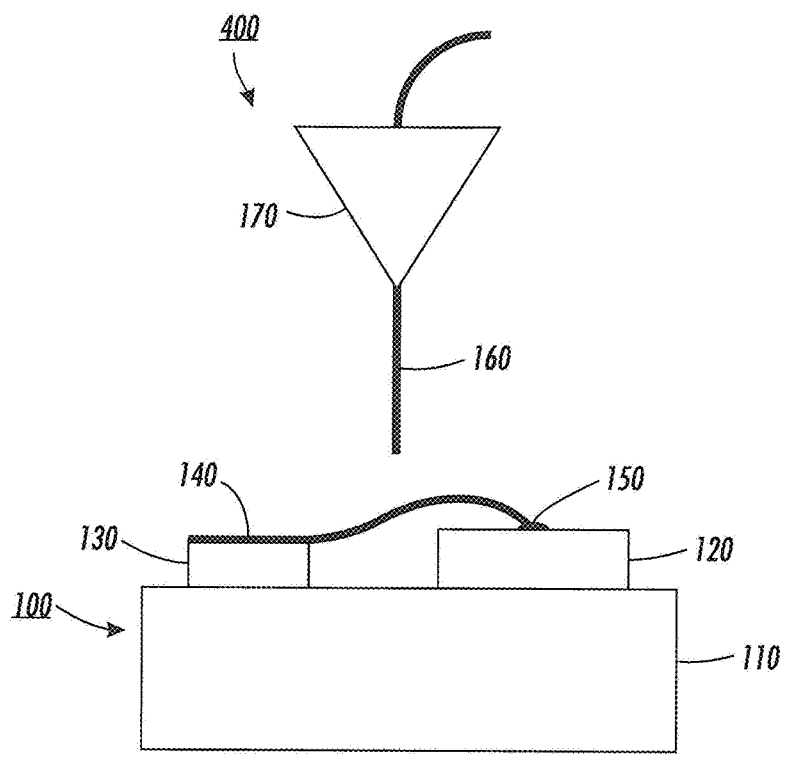
FIG. 4 is a side-view diagram illustrating an example method for manufacturing printed RFID tag, consistent with certain disclosed embodiments.

FIG. 4 is a side-view diagram illustrating an example method for manufacturing printed RFID tag, consistent with certain disclosed embodiments. Specifically, FIG. 4 illustrates an example RFID tag 100 having antenna 140 printed according to the methods and processes disclosed herein. As shown in FIG. 4, RFID tag 100 may include substrate 110, chip 120, receiving layer 130, and antenna 140. In some embodiment, RFID tag 110 may be an active RFID tag 140, and may include an on-board power supply (not shown), such as a battery. In other embodiments, RFID tag 140 may be a passive RFID tag 140, and may instead be powered by received RF interrogation signals.

In addition, as shown in FIG. 4, the manufacture of RFID tag 100 may also include wire/ribbon 160 and nozzle 170. Wire/ribbon 160 may be a wire or ribbon, as discussed above in connection with antenna 140 in FIG. 1, and may be used to form antenna 140 of RFID tag 100. Nozzle 170 may be any device configured to deposit or print wire/ribbon 160, consistent with the embodiments disclosed herein.

The present disclosure is not to be limited in terms of the particular embodiments described in this application, which are intended as illustrations of various aspects. Many modifications and variations can be made without departing from its spirit and scope, as will be apparent. Functionally equivalent methods and apparatuses within the scope of the disclosure, in addition to those enumerated herein, will be apparent from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one ore" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood, all language such as "up to," "at least," "greater than," "less than," and the like include the number recited and refer to ranges which can be subsequently broken down into subranges as discussed above. Finally, as will be understood, orange includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent. The various aspects and embodiments disclosed herein are for purposes of illustration and are not intended to be limiting, with the true scope and spirit being indicated by the following claims.

What is claimed is:

1. A method for manufacturing a radio frequency identification (RFID) tag assembly, comprising:
   attaching a chip to a top surface of a substrate;
   forming an RFID antenna receiving layer comprising a plurality of receiving pads in a pre-determined layout on the top surface of the substrate, wherein each receiving pad of the plurality of receiving pads is an electrical insulator; and
   forming an RFID antenna using a wire bonding process comprising:
      wire bonding a first end of a bond wire to a first receiving pad of the plurality of receiving pads;
      wire bonding a second end of the bond wire to the chip; and
      wire bonding the bond wire at an intermediate location between the first end and the second end to a second receiving pad of the plurality of receiving pads, wherein a majority of an entire length of the RFID antenna is formed by one or more bond wires and the pre-determined layout of the plurality of receiving pads provides a shape of the antenna.

2. The method for manufacturing the RFID tag assembly of claim 1, wherein the formation of the RFID antenna further comprises using a wedge bonding process as the wire bonding process.

3. The method for manufacturing the RFID tag assembly of claim 1, wherein the formation of the RFID antenna further comprises using a ball bonding process as the wire bonding process.

4. The method for manufacturing the RFID tag assembly of claim 1, further comprising:
   applying an electrically insulative pre-coated adhesive onto the substrate to form the plurality of receiving pads; and
   attaching the chip to the top surface of the substrate using the electrically insulative pre-coated adhesive that forms the plurality of receiving pads.

5. The method for manufacturing the RFID tag assembly of claim 1, further comprising wire bonding the majority of the entire length of the RFID antenna and wire bonding the second end of the bond wire to the chip using a continuous wire bonding process.

6. The method for manufacturing the RFID tag assembly of claim 1, wherein the formation of the RFID antenna further comprises wire bonding at least one of a copper wire or ribbon, an aluminum wire or ribbon, a palladium-covered copper wire or ribbon, and an aluminum-covered copper wire or ribbon to form the majority of the entire length of the RFID antenna.

7. The method of claim 1, wherein the forming of the RFID antenna positions the plurality of receiving pads between the top surface of the substrate and the RFID antenna.

8. The method of claim 1, further comprising forming the entire length of the antenna from the one or more bond wires.

9. A radio frequency identification (RFID) tag assembly, comprising:
 a substrate including a top surface;
 a receiving layer comprising a plurality of RFID antenna receiving pads in a pre-determined layout located on the top surface of the substrate, wherein each receiving pad of the plurality of receiving pads is an electrical insulator;
 a chip located on the top surface of the substrate; and
 an RFID antenna having an entire length, wherein:
  the RFID antenna comprises a bond wire having a first end attached to a first receiving pad of the plurality of receiving pads, a second end attached to the chip, and an intermediate location between the first end and the second end, wherein the intermediate location is attached to a second receiving pad of the plurality of receiving pads;
  the pre-determined layout of the plurality of receiving pads provides a shape of the antenna; and
  a majority of the entire length of the RFID antenna comprises one or more bond wires attached to the plurality of RFID antenna receiving pads and to the chip.

10. The RFID tag assembly of claim 9, wherein the one or more bond wires of the RFID antenna each comprises at least one wedge bonded bond.

11. The RFID tag assembly of claim 9, wherein the one or more bond wires of the RFID antenna each comprises at least one ball bonded bond wire.

12. The RFID tag assembly of claim 9, wherein:
 the receiving layer includes an electrically insulative pre-coated adhesive;
 the first end of the bond wire is attached to the electrically insulative pre-coated adhesive; and
 the chip is attached to the top surface of the substrate using the electrically insulative pre-coated adhesive.

13. The RFID tag assembly of claim 9, wherein the RFID antenna is at least one of a copper wire or ribbon, an aluminum wire or ribbon, a palladium-covered copper wire or ribbon, and an aluminum-covered copper wire or ribbon that provides the majority of the entire length of the RFID antenna.

14. The RFID tag assembly of claim 9, wherein the entire length of the RFID antenna is provided by the one or more bond wires.

15. A chipless radio frequency identification (RFID) tag assembly, comprising:
 a substrate including a top surface;
 a receiving layer, comprising a plurality of RFID antenna receiving pads located on the top surface of the substrate, wherein each receiving pad of the plurality of receiving pads is an electrical insulator; and
 an RFID antenna, wherein:
  the RFID antenna comprises a first end attached to one of the plurality of RFID antenna receiving pads, a second end opposite the first end, and an intermediate location between the first end and the second end, wherein the intermediate location is attached to a second receiving pad of the plurality of receiving pads;
  a majority of an entire length of the RFID antenna is provided by at least one bond wire; and
  the at least one bond wire is one of a copper bond wire, an aluminum bond wire, a palladium-covered copper bond wire, and an aluminum-covered copper bond wire.

16. The chipless RFID tag assembly of claim 15, wherein the receiving layer is positioned between the RFID antenna and the top surface of the substrate.

17. The chipless RFID tag assembly of claim 15, wherein the entire length of the RFID antenna is provided by the at least one bond wire.

* * * * *